US010149394B2

(12) United States Patent
Miura et al.

(10) Patent No.: US 10,149,394 B2
(45) Date of Patent: Dec. 4, 2018

(54) METHOD FOR FORMING CONDUCTOR LAYER, AND METHOD FOR PRODUCING MULTILAYER WIRING SUBSTRATE USING SAME

(71) Applicant: UBE INDUSTRIES, LTD., Ube-shi (JP)

(72) Inventors: Toru Miura, Ichihara (JP); Keita Bamba, Ichihara (JP); Masafumi Kohda, Ichihara (JP); Tadahiro Yokozawa, Ichihara (JP)

(73) Assignee: UBE INDUSTRIES, LTD., Ube-Shi (JP)

( * ) Notice: Subject to any disclaimer, the term of this patent is extended or adjusted under 35 U.S.C. 154(b) by 0 days.

(21) Appl. No.: 15/113,234

(22) PCT Filed: Jan. 21, 2015

(86) PCT No.: PCT/JP2015/051581
§ 371 (c)(1),
(2) Date: Jul. 21, 2016

(87) PCT Pub. No.: WO2015/111638
PCT Pub. Date: Jul. 30, 2015

(65) Prior Publication Data
US 2016/0353580 A1 Dec. 1, 2016

(30) Foreign Application Priority Data

Jan. 22, 2014 (JP) .................. 2014-009121
Jan. 22, 2014 (JP) .................. 2014-009123

(51) Int. Cl.
H05K 3/18 (2006.01)
B32B 15/08 (2006.01)
B32B 27/28 (2006.01)
H05K 1/03 (2006.01)
H05K 3/38 (2006.01)
C23C 18/16 (2006.01)
C23C 18/31 (2006.01)
H01J 37/32 (2006.01)
H05K 1/02 (2006.01)
H05K 3/00 (2006.01)
H05K 3/42 (2006.01)

(52) U.S. Cl.
CPC ............. H05K 3/181 (2013.01); B32B 15/08 (2013.01); B32B 27/281 (2013.01); C23C 18/1633 (2013.01); C23C 18/31 (2013.01); H01J 37/32009 (2013.01); H05K 1/0298 (2013.01); H05K 1/0346 (2013.01); H05K 3/0017 (2013.01); H05K 3/381 (2013.01); H05K 3/422 (2013.01); B32B 2457/08 (2013.01); H01J 2237/334 (2013.01); H05K 2201/0154 (2013.01); H05K 2203/072 (2013.01)

(58) Field of Classification Search
CPC .......... H01L 21/3111; H01L 21/67017; H01L 21/6708; B01D 1/0011; B01D 1/0041; B01D 1/0082; B01D 11/0484; B01D 11/0492; C09K 13/08
See application file for complete search history.

(56) References Cited

U.S. PATENT DOCUMENTS

| 5,130,192 | A | 7/1992 | Takabayashi et al. |
| 5,741,598 | A | 4/1998 | Shiotani et al. |
| 2002/0177000 | A1 | 11/2002 | Katsuki et al. |
| 2004/0067349 | A1* | 4/2004 | Okamura ................ B32B 15/08 428/209 |
| 2006/0115670 | A1* | 6/2006 | Tanaka ..................... B32B 7/10 428/615 |
| 2007/0196675 | A1 | 8/2007 | Hashimoto et al. |
| 2009/0117374 | A1 | 5/2009 | Hamada et al. |
| 2010/0183824 | A1* | 7/2010 | Seo ........................ H05K 3/181 427/560 |

(Continued)

FOREIGN PATENT DOCUMENTS

| CN | 1527763 | 9/2004 |
| CN | 1726259 A | 1/2006 |
| CN | 1933967 A | 3/2007 |

(Continued)

OTHER PUBLICATIONS

Office Action in Chinese Application No. 201580012080.5, dated Mar. 1, 2017.

(Continued)

Primary Examiner — Duy Vu N Deo
(74) Attorney, Agent, or Firm — Knobbe Martens Olson & Bear LLP

(57) ABSTRACT

A method for forming a conductor layer, including subjecting a surface of a polyimide film where a polyimide layer (a) is formed to polyimide etching treatment, to remove at least part of the polyimide layer (a), the polyimide film having the polyimide layer (a) formed on one surface or both surfaces of a polyimide layer (b); and then forming a conductor layer on the surface, such that the polyimide etching treatment time T (min), which is represented using t (min) defined by the formula as described below, is within the range of $0.2t \leq T \leq 5t$.

$$t(\min) = \frac{\text{Thickness of polyimide layer }(a)(\mu m)}{\text{Etching rate in the direction of thickness of polyimide layer }(a)(\mu m/\min)}$$

14 Claims, No Drawings

(56) References Cited

U.S. PATENT DOCUMENTS

2010/0266850 A1    10/2010    Shimoohsako et al.

FOREIGN PATENT DOCUMENTS

| JP | A-H03-159737 | 7/1991 |
| JP | A-H3-226916 | 10/1991 |
| JP | A-H9-099518 | 4/1997 |
| JP | A-2002-293965 | 10/2002 |
| JP | A-2004-276401 | 10/2004 |
| JP | A-2005-272520 | 10/2005 |
| JP | A-2006-305966 | 11/2006 |
| JP | A-2007-119573 | 5/2007 |
| JP | A-2008-068406 | 3/2008 |
| WO | WO 2007/123161 | 11/2007 |
| WO | WO 2009/075212 | 6/2009 |

OTHER PUBLICATIONS

International Preliminary Report on Patentability in International Patent Application No. PCT/JP2015/051581, dated Mar. 31, 2015.

* cited by examiner

METHOD FOR FORMING CONDUCTOR LAYER, AND METHOD FOR PRODUCING MULTILAYER WIRING SUBSTRATE USING SAME

This application is the U.S. National Phase under 35 U.S.C. § 371 of International Application No. PCT/JP2015/051581, filed Jan. 21, 2015, designating the U.S., and published in Japanese as WO 2015/111638 on Jul. 30, 2015, which claims priority to Japanese Patent Application Nos. 2014-009121 and 2014-009123, both filed Jan. 22, 2015, the entire contents of which are incorporated herein by reference.

TECHNICAL FIELD

The present invention relates to a method for forming a conductor layer, by which a conductor layer such as metal is formed on a surface of a polyimide film, and a method for producing a multilayer wiring substrate using the same.

BACKGROUND ART

An aromatic polyimide film has excellent various properties such as heat resistance, dimensional stability, electrical properties, and flame resistance, and also has flexibility, and therefore it has been widely used for a flexible printed circuit board (FPC), a TAB substrate, a COF substrate, and the like.

A multilayer FPC comprising a polyimide film is produced, for example, by laminating a polyimide film, which is to be an insulation layer, onto a wiring board having a copper wiring layer formed on a polyimide film, which is to be an insulation substrate, via a bonding sheet, and then forming a copper wiring layer on the surface thereof. A polyimide film having higher stiffness and lower coefficient of thermal expansion is preferred, because the polyimide film has higher handleability during processing/fabrication and a laminate in which a metal layer is laminated on the polyimide film has higher dimensional accuracy. On the other hand, the polyimide film tends to have lower adhesiveness to a metal layer, and therefore an adequate peel strength may not be achieved. Among various polyimides, a polyimide having high chemical stability and being strong, in particular, is hardly influenced by an extrinsic operation, and therefore has the problem of hardly having an adequate peel strength as compared with a chemically sensitive polyimide.

A surface of an insulation layer where a wiring layer is formed may need to be subjected to roughening treatment to achieve anchor effect which is a mechanical linkage, or other treatment to improve physical or chemical interaction so as to ensure the adhesion to the wiring layer (generally, metal layer) formed thereon. As a method for improving the adhesiveness of a polyimide film to a metal, a method wherein an aminosilane-based, epoxysilane-based, or titanate-based heat-resistant surface treatment agent is used during the film production is proposed (Patent Literature 1). Additionally, a method wherein a surface of a polyimide film is treated with an aqueous solution containing potassium permanganate and/or sodium permanganate, and potassium hydroxide and/or sodium hydroxide is also proposed (Patent Literature 2).

In addition, a polyimide film in which a layer of an amorphous polyimide containing a heat-resistant surface treatment agent is formed on at least one surface of a core layer formed of a polyimide having higher stiffness and lower coefficient of thermal expansion (Patent Literature 3) and a polyimide film for metallizing, which has a thin layer formed of a certain polyimide and containing a heat-resistant surface treatment agent on one surface or both surfaces of a polyimide layer (Patent Literature 4) are also proposed. Additionally, a laminate wherein a resin material consisting of "polymer film/plating formation layer containing crystalline thermoplastic resin" is plated, and the laminate consists of "polymer film/plating formation layer containing crystalline thermoplastic resin/plating layer" (Patent Literature 5) is also proposed.

A connection between wiring layers in a multilayer FPC is made by forming a via in a polyimide film, which is an insulation layer, and plating the inside of the via with metal. The formation of the via as described above is performed by laser, or the like. Therein a resin residue (smear) inevitably remains in the bottom of the via, and therefore a desmear treatment to remove the smear is indispensable. The desmear treatment is often performed by a method wherein etching is chemically performed with an alkaline aqueous solution of permanganate, or the like. By the desmear treatment, the surface of the polyimide film having adhesiveness improved as described above may be affected and thereby adequate adhesiveness may not be achieved, or the uniformity of the surface of the polyimide film may be impaired and thereby the electrical reliability may be decreased when a fine circuit is formed thereon.

CITATION LIST

Patent Literature

Patent Literature 1: JP-A-H03-159737
Patent Literature 2: JP-A-2002-293965
Patent Literature 3: JP-A-2005-272520
Patent Literature 4: WO2007/123161
Patent Literature 5: WO2009/075212

SUMMARY OF INVENTION

Technical Problem

An object of the present invention is to provide a method for forming a conductor layer on a polyimide film, wherein the conductor layer has an excellent initial peel strength and also has a suppressed reduction in peel strength after storage under high temperature conditions or under high humidity conditions. Another object of the present invention is to provide a method for producing a multilayer wiring substrate, comprising steps of laminating a polyimide film onto a printed wiring board in which a conductor wiring pattern is formed on an insulation substrate; forming a via to the conductor wiring pattern from the surface of the polyimide film; performing desmear treatment; and then forming a conductor layer on all or part of the surface of the polyimide film and within the via, wherein the conductor layer formed on the polyimide has an excellent peel strength and also has a suppressed reduction in peel strength after storage under high temperature conditions or under high humidity conditions.

Solution to Problem

The present invention relates to the following items.
[1] A method for forming a conductor layer, comprising steps of:

subjecting a surface of a polyimide film where a polyimide layer (a) is formed to polyimide etching treatment, to remove at least part of the polyimide layer (a), wherein the polyimide film has the polyimide layer (a) formed on one surface or both surfaces of a polyimide layer (b); and then forming a conductor layer on the surface, wherein the polyimide etching treatment time T (min), which is represented using t (min) defined by the formula as described below, is within the range of 0.2t≤T≤5t.

$$t(\min) = \frac{\text{Thickness of polyimide layer }(a)(\mu m)}{\text{Etching rate in the direction of thickness of polyimide layer }(a)(\mu m/\min)}$$

[2] The method for forming a conductor layer as described in [1], wherein the polyimide layer (b) consists essentially of polyimide obtained using 3,3',4,4'-biphenyltetracarboxylic acid compound in an amount of 90 mol % or more as the tetracarboxylic acid component, and 4,4'-diaminodiphenyl ether and/or p-phenylenediamine in an amount of 90 mol % or more as the diamine component, and the polyimide layer (a) consists essentially of polyimide obtained using 3,3',4,4'-biphenyltetracarboxylic acid compound, 2,3,3',4'-biphenyltetracarboxylic acid compound, pyromellitic acid compound, or a plurality of compounds selected from these compounds as the tetracarboxylic acid component, and p-phenylenediamine, 4,4'-diaminodiphenyl ether, 4,4'-diaminodiphenyl methane, 2,2-bis(4-aminophenyl)propane, 1,3-bis(4-aminophenoxy benzene), 1,4-bis(4-aminophenoxy)benzene, 4,4'-bis(4-aminophenyl)diphenyl ether, 4,4'-bis(4-aminophenyl)diphenyl methane, 4,4'-bis(4-aminophenoxy)diphenyl ether, 4,4'-bis(4-aminophenoxy)diphenyl methane, 2,2-bis[4-(aminophenoxy)phenyl]propane, or a plurality of compounds selected from these compounds as the diamine component, with the proviso that polyimide obtained using 3,3',4,4'-biphenyltetracarboxylic acid compound in an amount of 90 mol % or more as the tetracarboxylic acid component, and 4,4'-diaminodiphenyl ether and/or p-phenylenediamine in an amount of 90 mol % or more as the diamine component is excluded.

[3] The method for forming a conductor layer as described in [1] or [2], wherein the polyimide layer (a) consists of polyimide obtained from a polyimide precursor composition comprising any one or more of an aminosilane compound, an epoxysilane compound, an aluminum compound, or a titanate compound.

[4] The method for forming a conductor layer as described in any one of [1] to [3], wherein the chemical etching rate of the polyimide constituting the polyimide layer (b) with a polyimide etching solution is lower than the chemical etching rate of the polyimide constituting the polyimide layer (a) with the polyimide etching solution.

[5] The method for forming a conductor layer as described in any one of [1] to [4], wherein the thickness of the polyimide layer (b) is 1 μm to 100 μm, and the thickness of the polyimide layer (a) is 0.05 μm to 5 μm.

[6] The method for forming a conductor layer as described in any one of [1] to [5], wherein the polyimide film is a polyimide film obtained by applying a polyimide precursor solution, which is to be formed into the polyimide layer (a), to at least one surface of a self-supporting film obtained from a polyimide precursor solution, which is to be formed into the polyimide layer (b); and then subjecting the film to heat treatment at a temperature of 350° C. to 600° C.

[7] The method for forming a conductor layer as described in any one of [1] to [6], wherein the polyimide etching treatment is wet etching treatment with a polyimide etching solution, or dry etching treatment by plasma treatment.

[8] The method for forming a conductor layer as described in any one of [1] to [7], wherein a metal film layer as the conductor layer is formed on the surface of the polyimide film by electroless plating.

[9] A method for producing a multilayer wiring substrate, comprising steps of:

laminating a polyimide film onto a printed wiring board in which a conductor wiring pattern is formed on an insulation substrate;

forming a via to the conductor wiring pattern from the surface of the polyimide film;

performing desmear treatment; and then forming a conductor layer on all or part of the surface of the polyimide film and within the via, wherein the polyimide film is a polyimide film in which a polyimide layer (a) is formed on one surface or both surfaces of a polyimide layer (b) and the polyimide layer (a) is formed at least on the surface which is not in contact with the printed wiring board; and the desmear treatment time T (min), which is represented using t (min) defined by the formula as described below, is within the range of 0.2t≤T≤5t, and is the time at which the desmearing is completed.

$$t(\min) = \frac{\text{Thickness of polyimide layer }(a)(\mu m)}{\text{Etching rate in the direction of thickness of polyimide layer }(a)(\mu m/\min)}$$

[10] The method for producing a multilayer wiring substrate as described in [9], wherein the polyimide layer (b) consists essentially of polyimide obtained using 3,3',4,4'-biphenyltetracarboxylic acid, compound in an amount of 90 mol % or more as the tetracarboxylic acid component, and 4,4'-diaminodiphenyl ether and/or p-phenylenediamine in an amount of 90 mol % or more as the diamine component, and the polyimide layer (a) consists essentially of polyimide obtained using 3,3',4,4'-biphenyltetracarboxylic acid compound, 2,3,3',4'-biphenyltetracarboxylic acid compound, pyromellitic acid compound, or a plurality of compounds selected from these compounds as the tetracarboxylic acid component, and p-phenylenediamine, 4,4'-diaminodiphenyl ether, 4,4'-diaminodiphenyl methane, 2,2-bis(4-aminophenyl)propane, 1,3-bis(4-aminophenoxy benzene), 1,4-bis(4-aminophenoxy)benzene, 4,4'-bis(4-aminophenyl)diphenyl ether, 4,4'-bis(4-aminophenyl)diphenyl methane, 4,4'-bis(4-aminophenoxy)diphenyl ether, 4,4'-bis(4-aminophenoxy)diphenyl methane, 2,2-bis[4-(aminophenoxy)phenyl]propane, or a plurality of compounds selected from these compounds as the diamine component, with the proviso that polyimide obtained using 3,3',4,4'-biphenyltetracarboxylic acid compound in an amount of 90 mol % or more as the tetracarboxylic acid component, and 4,4'-diaminodiphenyl ether and/or p-phenylenediamine in an amount of 90 mol % or more as the diamine component is excluded.

[11] The method for producing a multilayer wiring substrate as described in [9] or [10], wherein the polyimide layer (a) consists of polyimide obtained from a polyimide precursor composition comprising any one or more of an aminosilane compound, an epoxysilane compound, an aluminum compound, or a titanate compound.

[12] The method for producing a multilayer wiring substrate as described in any one of [9] to [11], wherein the chemical etching rate of the polyimide constituting the polyimide layer (b) with a polyimide etching solution is lower than the chemical etching rate of the polyimide constituting the polyimide layer (a) with the polyimide etching solution.

[13] The method for producing a multilayer wiring substrate as described in any one of [9] to [12], wherein the thickness of the polyimide layer (b) is 1 μm to 100 μm, and the thickness of the polyimide layer (a) is 0.05 μm to 5 μm.

[14] The method for producing a multilayer wiring substrate as described in any one of [9] to [13], wherein the polyimide film is a polyimide film obtained by applying a polyimide precursor solution, which is to be formed into the polyimide layer (a), to at least one surface of a self-supporting film obtained from a polyimide precursor solution, which is to be formed into the polyimide layer (b); and then subjecting the film to heat treatment at a temperature of 350° C. to 600° C.

[15] The method for producing a multilayer wiring substrate as described in any one of [9] to [14], wherein the desmear treatment is wet etching treatment with a polyimide etching solution, or dry etching treatment by plasma treatment.

[16] The method for producing a multilayer wiring substrate as described in any one of [9] to [15], wherein the conductor layer is formed by metallizing all or part of the surface of the polyimide film and the inside of the via by electroless plating after the desmear treatment is performed.

Advantageous Effects of Invention

According to the method of the present invention for forming a conductor layer, the adhesion of the polyimide film to the conductor such as metal may be improved without roughening the surface of the polyimide film. Additionally, a flaw in the surface of the polyimide film, which occurs during the production and transport of the polyimide film, is removed by the polyimide etching treatment. Thus a laminate which has an excellent initial peel strength and also has a suppressed reduction in peel strength after storage under high temperature conditions or under high humidity conditions, while keeping the interface between the conductor and the polyimide film in a state of being smooth, may be obtained.

Meanwhile, according to the method of the present invention for producing a multilayer wiring substrate, the adhesion between the conductor such as metal and the polyimide film after the desmear treatment to remove the resin residue formed by the via machining (via formation), and the like may be improved without roughening the surface of the polyimide film. Thus a multilayer wiring substrate which has an excellent initial peel strength and also has a suppressed reduction in peel strength after storage under high temperature conditions or under high humidity conditions, while keeping the interface between the conductor (conductor wiring pattern) and, the polyimide film in a state of being smooth, may be obtained. Additionally, a flaw readily occurs in the polyimide surface during the lamination operation in the production of the multilayer wiring substrate, and the flaw is removed by the desmear treatment, thereby enhancing the smoothness of the interface between the insulation layer (that is, polyimide film layer) and the conductor layer in the obtained substrate. Therefore, the uniformity of the interface between the insulation layer and the conductor layer may be improved and the electrical reliability of the wiring substrate having a fine circuit formed thereon may be increased.

DESCRIPTION OF EMBODIMENTS

According to the method of the present invention for forming a conductor layer, a polyimide film in which a polyimide layer (a) is formed on one surface or both surfaces of a polyimide layer (b) is subjected to etching treatment under certain conditions to remove at least part of the polyimide layer (a), and then a conductor layer is formed on the surface of the polyimide film (surface where at least part of the polyimide layer (a) is removed) by dry plating, wet plating, or application or printing of ink, or combination thereof, for example. The conductor layer as used herein means widely a layer formed of a material which conducts electricity, including metal alloy and additive-containing metal, semiconductor and metal oxide, and organic conductor and organic semiconductor, in addition to pure metal.

According to the method of the present invention for producing a multilayer wiring substrate, a polyimide film in which a polyimide layer (a) is formed on one surface or both surfaces of a polyimide layer (b) is laminated onto a printed wiring board in which a conductor wiring pattern is formed on an insulation substrate. Subsequently, a via is formed from the surface of the polyimide film to the conductor wiring pattern, and desmear treatment (etching treatment to remove the smear) is performed under certain conditions to remove the smear and at least part of the polyimide layer (a), and then a conductor layer is formed on all or part of the surface of the polyimide film and within the via. Copper is generally used as the conductor, although the conductor is not limited thereto.

The polyimide film used in the present invention is a multilayer film in which a polyimide layer (a) is formed on one surface or both surfaces of a polyimide layer (b), and it is preferred that the chemical etching rate of the polyimide constituting the polyimide layer (b) is lower than the chemical etching rate of the polyimide constituting the polyimide layer (a). The chemical etching rate is an index of the sensitiveness to chemical action, and therefore this means that it is preferred that the polyimide constituting the polyimide layer (a) is more sensitive to chemical action as compared with the polyimide constituting the polyimide layer (b) in the polyimide film used in the present invention. The chemical etching rate as used herein is the depth (length) of the polyimide film etched in the direction of film thickness per unit time in the chemical etching which is a wet etching treatment with a polyimide etching solution, and may be expressed in μm/min, for example. In the present invention, the depth (μm) of the polyimide film etched for 1 minute from the start of etching is measured and the measured value is used as the chemical etching rate (μm/min).

The chemical etching means a wet etching treatment with a polyimide etching solution, and is a treatment in which a polyimide is decomposed or swelled by chemical action, and removed. Examples of the polyimide etching solution include a hydrazine-based etching solution, oxidizing etching solutions such as an aqueous solution of permanganate, strong alkaline aqueous solutions such as an aqueous solution of sodium hydroxide, and an alkaline aqueous solution of permanganate. The fact that the chemical etching rate of the polyimide constituting the polyimide layer (a) is higher than that of the polyimide constituting the polyimide layer (b) means that the polyimide constituting the polyimide layer (a) is more sensitive to chemical action.

The high/low relation between the etching rates of the polyimide constituting the polyimide layer (a) and the polyimide constituting the polyimide layer (b) may differ between chemical etching and, dry etching. The decomposition of the polyimide in chemical etching has a strong tendency to proceed from a chemically weak site as the starting point, whereas the decomposition of the polyimide by dry etching does not necessarily start from a chemically weak site, and therefore the etching rate may not reflect the chemical sensitiveness notably. In general, the high/low relation of the chemical etching rate is the same irrespective of the type of the polyimide etching solution, and therefore the polyimide film used in the present invention may be any polyimide film, on the condition that the polyimide constituting the polyimide layer (a) has a higher chemical etching rate than the polyimide constituting the polyimide layer (b) irrespective of the high/low relation of the etching rate in dry etching.

In the present invention, the relation between the chemical etching rate of the polyimide constituting the polyimide layer (a) and the chemical etching rate of the polyimide constituting the polyimide layer (b), that is, high/low relation between the etching rates under the same conditions is important. A method for determining the chemical etching rate under a typical chemical etching condition is as follows.

An aqueous solution wherein the concentration of manganese derived from permanganate is 2 to 2.5 wt %, particularly preferably 2.2 to 2.4 wt %, is prepared from sodium permanganate or potassium permanganate, or a mixture thereof. The pH is adjusted to be 12 to 14 by adding sodium hydroxide to the resulting solution, to provide a polyimide etching solution. A polyimide film is immersed in the polyimide etching solution at 70° C. for 1 minute, and then neutralized in a solution obtained by diluting concentrated sulfuric acid with water to 10 g/L. Subsequently, the polyimide film is dried sufficiently, and then the thickness thereof is measured, and thereby the chemical etching rate (μm/min) can be calculated as the decrement of the thickness.

In the case of the chemical etching rate determined by the method as described above, it is preferred that the ratio of the chemical etching rate of the polyimide constituting the polyimide layer (b) to the chemical etching rate of the polyimide constituting the polyimide layer (a) is within the range of 0 to ½, particularly preferably 0 to ⅕. In this case, a layer of polyimide which is more sensitive to chemical action is formed on a layer of polyimide which has higher chemical stability, and this characteristic is more notably exhibited when the ratio as described above is small, that is, the difference in chemical etching rate is great. When the surface layer of the polyimide film having such a layer structure is removed in a certain amount, the surface which consists mainly of the polyimide having high chemical stability and partly comprises the chemically sensitive polyimide is exposed, and therefore a conductor layer which has excellent adhesion and is stable under high temperature conditions or under high humidity conditions, in particular, can be formed thereon.

The etching rate of the polyimide in the polyimide etching treatment step or the desmear treatment step of the present invention differs according to the etching conditions. In the polyimide etching treatment step or the desmear treatment step of the present invention, it is preferred that the etching condition is set such that the etching rate (Va) of the polyimide constituting the polyimide layer (a) is 0.01 to 1.0 μm/min, particularly preferably 0.05 to 0.5 μm/min. When the Va is too high, it may be difficult to etch the surface of the polyimide film uniformly. When the Va is too low, the etching treatment may take time, which may not be preferred in view of production efficiency.

In the polyimide etching treatment step or the desmear treatment step of the present invention, there is no limit to the etching rate (Vb) of the polyimide constituting the polyimide layer (b). In the case of Va<Vb, the polyimide layer (b) may be excessively removed, and therefore the adhesion to the conductor layer, the electrical reliability when used for a wiring substrate, or the like may be unfavorably affected. Thus that is not preferred.

The polyimide layer (a) preferably consists of polyimide obtained using 3,3',4,4'-biphenyltetracarboxylic acid compound, 2,3,3',4'-biphenyltetracarboxylic acid compound, pyromellitic acid compound, or a plurality of compounds selected from these compounds as the tetracarboxylic acid component, and p-phenylenediamine, 4,4'-diaminodiphenyl ether, 4,4'-diaminodiphenyl methane, 2,2-bis(4-aminophenyl)propane, 1,3-bis(4-aminophenoxy benzene), 1,4-bis(4-aminophenoxy)benzene, 4,4'-bis(4-aminophenyl)diphenyl ether, 4,4'-bis(4-aminophenyl)diphenyl methane, 4,4'-bis(4-aminophenoxy)diphenyl ether, 4,4'-bis(4-aminophenoxy)diphenyl methane, 2,2-bis[4-(aminophenoxy)phenyl]propane, or a plurality of compounds selected from these compounds as the diamine component, although the polyimide layer (a) is not limited thereto. However, polyimide obtained using 3,3',4,4'-biphenyltetracarboxylic acid compound in an amount of 90 mol % or more as the tetracarboxylic acid component, and 4,4'-diaminodiphenyl ether and/or p-phenylenediamine in an amount of 90 mol % or more as the diamine component is excluded.

In the present invention, the polyimide layer (a) particularly preferably consists of polyimide obtained from 2,3,3',4'-biphenyltetracarboxylic acid compound and 4,4'-diaminodiphenyl ether, or polyimide obtained from pyromellitic acid compound and 4,4'-diaminodiphenyl ether. Also, the polyimide layer (a) preferably consists of polyimide obtained from 3,3',4,4'-biphenyltetracarboxylic acid compound and pyromellitic acid compound, and p-phenylenediamine, or p-phenylenediamine and 4,4'-diaminodiphenyl ether. In this case, it is preferred that the ratio of pyromellitic acid compound in the tetracarboxylic acid component is within the range of 50 mol % to 95 mol %, and the ratio of 4,4'-diaminodiphenyl ether in the diamine component is within the range of 15 mol % to 100 mol %.

The polyimide layer (b) preferably has high chemical stability, and preferably consists of polyimide obtained using 3,3',4,4'-biphenyltetracarboxylic acid compound in an amount of 90 mol % or more as the tetracarboxylic acid component, and 4,4'-diaminodiphenyl ether and/or p-phenylenediamine in an amount of 90 mol % or more as the diamine component, although the polyimide layer (b) is not limited thereto. In the present, invention, the polyimide layer (b) particularly preferably consists of polyimide obtained from 3,3',4,4'-biphenyltetracarboxylic dianhydride, and 4,4'-diaminodiphenyl ether and/or p-phenylenediamine, more preferably p-phenylenediamine.

The 3,3',4,4'-biphenyltetracarboxylic acid compound includes 3,3',4,4'-biphenyltetracarboxylic acid, and salts thereof and esterified compounds thereof, in addition to 3,3',4,4'-biphenyltetracarboxylic dianhydride. As for other tetracarboxylic acid compounds, the tetracarboxylic acid compound includes the tetracarboxylic acid, dianhydride thereof, salts thereof, and esterified compounds thereof.

Examples of the other tetracarboxylic acid component used as the constituent component of the polyimide layer (b) include 2,3,3',4'-biphenyltetracarboxylic acid compound, pyromellitic acid compound, and 4,4'-oxydiphthalic acid compound. Examples of the other diamine component include 4,4'-diaminodiphenyl methane.

The polyimide layer (a) and the polyimide layer (b) may comprise an additive component such as silica in addition to the polyimide, on the condition that the characteristic of the present invention would not be impaired.

The polyimide film used in the present invention may be produced by subjecting a multilayer self-supporting film, which is obtained by applying a polyimide precursor solution to be converted into the polyimide layer (a) [which is referred to as "polyamic acid solution (A)"] to one surface or both surfaces of a self-supporting film obtained by flow-casting a polyimide precursor solution to be converted into the polyimide layer (b) [which is referred to as "polyamic acid solution (B)"] on a support and drying the solution, to heat treatment preferably at a temperature of 350° C. to 600° C., to imidize the multilayer self-supporting film. The polyimide film may be also produced by a method wherein multilayer extrusion is conducted using the polyamic acid solution (A) and the polyamic acid solution (B), and the resulting film is imidized. The polyamic acid solution (A) and the polyamic acid solution (B) may comprise an additive component such as silica.

A polyimide precursor solution (usually, polyamic acid solution) may be produced by polymerizing/reacting the tetracarboxylic acid component and the diamine component in an organic polar solvent. A polyamic acid solution may be obtained, for example, by mixing these two components in a substantially equimolar amount, and polymerizing/reacting these components at a reaction temperature of 100° C. or lower, preferably 80° C. or lower, for about 0.2 hours to about 60 hours.

Examples of the organic polar solvent include amides such as N-methyl-2-pyrrolidone, N,N-dimethylacetamide, N,N-diethylacetamide, N,N-dimethylformamide, N,N-diethylformamide, and hexamethylsulforamide; sulfoxides such as dimethylsulfoxide, and diethylsulfoxide; and sulfones such as dimethylsulfone, and diethylsulfone. These solvents may be used alone, or may be used in combination.

The concentration of all monomers in the polyamic acid solution (A) may be preferably 1 wt % to 15 wt %, more preferably 2 wt % to 12 wt %, particularly preferably 3 wt % to 10 wt %. Meanwhile, the concentration of all monomers in the polyamic acid solution (B) may be preferably 5 wt % to 40 wt %, more preferably 6 wt % to 35 wt %, particularly preferably 10 wt % to 30 wt %. As for the polyamic acid solutions, the rotational viscosity which is measured at 30° C. may be preferably about 0.1 poise to about 50000 poise, particularly preferably 0.5 poise to 30000 poise, more preferably about 1 poise to about 20000 poise, in view of workability for handling the polyamic acid solution.

For the purpose of accelerating imidization, 1,2-dimethylimidazole may be preferably added to the polyamic acid solution (B) to be converted into the polyimide layer (b) in an amount of 0.005 equivalents to 2 equivalents, particularly preferably 0.02 equivalents to 0.8 equivalents, relative to the amic acid unit in the polyamic acid. Meanwhile, part of 1,2-dimethylimidazole may be replaced by imidazole, benzimidazole, N-methylimidazole, N-benzyl-2-methylimidazole, 2-methylimidazole, 2-ethyl-4-methylimidazole, 5-methylbenzimidazole, isoquinoline, 3,5-dimethylpyridine, 3,4-dimethylpyridine, 2,5-dimethylpyridine, 2,4-dimethylpyridine, 4-n-propylpyridine, or the like.

The polyamic acid solution (A) may comprise a heat-resistant surface treatment agent. In other words, the polyimide layer (a) may consist of a polyimide obtained from a polyamic acid solution (polyimide precursor composition) which comprises one or more of heat-resistant surface treatment agents. Examples of the heat-resistant surface treatment agent include aminosilane-based surface treatment agents, epoxysilane-based surface treatment agents, aluminum-based surface treatment agents, and titanate-based surface treatment agents. Examples of the aminosilane-based surface treatment agent include aminosilane compounds such as γ-aminopropyl triethoxy silane, N-β-(aminoethyl)-γ-aminopropyl triethoxy silane, N-(aminocarbonyl)-γ-aminopropyl triethoxy silane, N-[β-(phenylamino) ethyl]-γ-aminopropyl triethoxy silane, N-phenyl-γ-aminopropyl triethoxy silane, and γ-phenyl aminopropyl trimethoxy silane. Examples of the epoxysilane-based surface treatment agent include epoxysilane compounds such as β-(3,4'-epoxycyclohexyl) ethyl trimethoxy silane, and γ-glycidoxypropyl trimethoxy silane. Examples of the aluminum-based surface treatment agent include aluminum compounds such as aluminum hydroxide, aluminum monoethyl acetate diisopropylate, aluminum diethyl acetate monoisopropylate, aluminum triacetyl acetonate, aluminum triethyl acetoacetate, aluminum isopropylate, and aluminum butylate. Examples of the titanate-based surface treatment agent include titanate compounds such as isopropyl tricumyl phenyl titanate, and dicumyl phenyl oxyacetate titanate. In the present invention, an aminosilane-based surface treatment agent may be preferably used.

The polyimide film may be produced, for example, by the method as described below.

The polyamic acid solution (B) is flow-cast on a support, using a film-forming apparatus equipped with an extrusion die, or the like, and then the solvent is gradually removed therefrom by the application of heat, and thereby the polyamic acid solution (B) is dried to be converted into a self-supporting film. The drying temperature may be preferably 100° C. to 180° C., more preferably 120° C. to 160° C. A stainless substrate, a stainless belt, a heat-resistant resin belt, or the like may be used as the support, for example.

It is preferred that the self-supporting film has a solvent content within the range of 20 wt % to 40 wt %, and it is preferred that the self-supporting film has an imidization degree within the range of 5% to 40%. When the imidization degree is too high, the adhesion strength between the polyimide layers (a) and (b) in the obtained polyimide film may be low and the delamination may occur. When the imidization degree is too low, a trouble such as the occurrence of foaming or cracking in the film may occur in the solvent removal step and the imidization step subsequent to the application of the polyamic acid solution (A). Additionally, the mechanical properties of the obtained polyimide film may be deteriorated.

Subsequently, the self-supporting film is peeled from the support, and then the polyamic acid solution (A) is uniformly applied to at least one surface or both surfaces of the film by a known method such as gravure coating method, spin coating method, silk screen coating method, dip coating method, spray coating method, bar coating method, knife coating method, roll coating method, blade coating method, and die coating method. And then, heating/drying treatment is performed as necessary, to remove part of, or all of the solvent contained in the applied polyamic acid solution therefrom. The heating/drying treatment may be preferably performed at a temperature of 120° C. or lower, more preferably 100° C. or lower.

The multilayer self-supporting film thus obtained is fixed with a pin tenter, a clip, a metal, or the like, and heated, to imidize the film. The heat treatment may be preferably performed stepwise. For example, heat treatment at a relatively low temperature of 100° C. to 200° C. for 1 minute to 60 minutes is performed firstly. And then, heat treatment is performed while the temperature is increased from 200° C. continuously or stepwise, and finally heat treatment at a temperature of 350° C. to 600° C. for 1 minute to 60 minutes is performed, thereby completing imidization.

A multilayer self-supporting film may also be obtained by flow-casting the polyamic acid solution (A) and the polyamic acid solution (B) on a support simultaneously, using a film-forming apparatus equipped with a multilayer extrusion die, or the like, and then gradually removing the solvent therefrom by the application of heat, and thereby drying the polyamic acid solutions (A) and (B) to be converted into a self-supporting film.

The thickness of the polyimide layer (b) is preferably 1 μm to 100 μm, particularly preferably 5 μm to 50 μm. When, the thickness of the polyimide layer (b) is less than 5 μm, a problem may arise in the mechanical strength or the dimensional stability of the multilayer polyimide film produced. Meanwhile, the thickness of the polyimide layer (a) is preferably 0.05 μm to 5 μm, particularly preferably 0.1 μm to 1 μm.

According to the method of the present invention for forming a conductor layer, the surface of the polyimide film thus obtained where the polyimide layer (a) is formed is subjected to polyimide etching treatment. And then, a conductor layer is formed on the surface where at least part of the polyimide layer (a) is removed by the polyimide etching treatment. Thus a conductor-laminated polyimide film may be obtained.

The polyimide film etching condition may be any condition, on the condition that the polyimide layer (a) is at least partially etched and the properties of the polyimide film as a whole would not be significantly impaired by etching the polyimide layer (b). More specifically, the polyimide etching treatment time T (min), which is represented using t (min) defined by the formula as described below, is set within the range of $0.2t \leq T \leq 5t$, wherein the range is defined by the lower limit of the time, which is represented by 0.2 t, and the upper limit of the time, which is represented by 5 t. Additionally, it is preferred that the polyimide etching treatment time T (min) is within the range which is defined by the lower limit of the time selected from 0.3 t, 1.0 t, or 1.2 t, and the upper limit of the time selected from 4 t, 3.4 t, 3 t, or 2.7 t. The t (min) is the etching time at which all of the polyimide layer (a) is removed in theory.

$$t(min) = \frac{\text{Thickness of polyimide layer } (a)(\mu m)}{\text{Etching rate in the direction of thickness of polyimide layer } (a)(\mu m/min)}$$

Meanwhile, it is preferred that the depth of the flaw which occurs during the production and transport of the polyimide film, or the like, is taken into consideration for the etching condition. For obtention of a conductor-laminated polyimide film in which the interface between the conductor layer and the polyimide is smooth, it is necessary to etch the polyimide film under conditions that the polyimide film is etched at least to the depth of the flaw. The polyimide film may be usually etched to a depth of 0.1 μM or more so as to remove a flaw which may occur during the process, and this may be compatible with the condition as described above.

According to the method of the present invention for forming a conductor layer, the etching of the polyimide film may be performed either by dry etching method or by wet etching method. Examples of the dry etching method include plasma etching method (dry etching by plasma treatment), and the like. Examples of the wet etching method include a method wherein a polyimide etching solution is used (wet etching with a polyimide etching solution). Examples of the polyimide etching solution include a hydrazine-based etching solution, oxidizing etching solutions such as an aqueous solution of permanganate, strong alkaline aqueous solutions such as an aqueous solution, of sodium hydroxide, and an alkaline aqueous solution of permanganate.

According to the method of the present invention for forming a conductor layer, a conductor layer is formed on the polyimide film which was subjected to polyimide etching treatment as described above. The method for forming a conductor layer is not specifically limited, and any method such as dry plating, wet plating, and application or printing of metal ink may be used. Examples of the dry plating include vacuum deposition, sputtering, ion plating, and electron beam. Examples of the wet plating include electroless plating, and electrolytic plating. Examples thereof also include a method wherein a conductor layer is formed by applying or printing an ink containing metal nanoparticles, and then subjecting the ink to heat treatment or light irradiation.

In the method of the present invention for forming a conductor layer, a metal film layer as the conductor layer may be preferably formed on the surface of the polyimide film by electroless plating. Additionally, electrolytic plating may be further performed after the performance of electroless plating. It is preferred that a metal film layer is formed by a method wherein electroless nickel plating is performed, and then electrolytic copper plating is further performed, for example. The electroless plating may be performed using a conventionally-known method. Examples thereof include the Elfseed Process of JCU Corporation, and the SLP process, Top Piena Process of Okuno Chemical Industries Co., Ltd.

According to the method of the present invention for producing a multilayer wiring substrate, the polyimide film thus obtained is laminated onto a printed wiring board in which a conductor wiring pattern is formed on an insulation substrate, and then a via is formed from the surface of the polyimide film to the conductor wiring pattern of the printed wiring board, and desmear treatment is performed. The polyimide film is laminated herein such that the surface where the polyimide layer (a) is formed is exposed at the surface.

In general, the polyimide film is laminated onto a printed wiring board via a bonding sheet, or by forming a thermal-fusion bondable layer on the surface of the polyimide film which is to be placed on the printed wiring board, and then thermal-fusion bonding the polyimide film to the printed wiring board, although the method of polyimide film lamination is not limited thereto. Additionally, the via formation is generally performed by the use of laser. The methods may be selected from among known methods and adopted.

The desmear treatment, that is, the polyimide etching in the method of the present invention for producing a multilayer wiring substrate may be performed either by dry etching method or by wet etching method. Examples of the dry etching method include plasma etching method, and the like. Examples of the wet etching method include a method wherein a polyimide etching solution is used. Examples of the polyimide etching solution include a hydrazine-based etching solution, oxidizing etching solutions such as an aqueous solution of permanganate, strong alkaline aqueous solutions such as an aqueous solution of sodium hydroxide, and an alkaline aqueous solution of permanganate.

As for the desmear treatment condition, the lower limit of the desmear treatment time T may be any value, on the condition that the adhesion to the metal film is exhibited, and the smear in the via is sufficiently removed and the desmearing is completed. Meanwhile, the upper limit of the desmear treatment time T may be any value, on the condition that the adhesion would not be reduced and the properties of the polyimide film as a whole would not be significantly impaired by etching the polyimide layer (b), and the shape of the via would not be significantly altered. More specifically, the desmear treatment time T (min), which is represented using t (min) defined by the formula as described below, is set within the range of 0.2t≤T≤5t, wherein the range is defined by the lower limit of the time, which is represented by 0.2 t, and the upper limit of the time, which is represented by 5 t. Additionally, it is preferred that the desmear treatment time T (min) is within the range which is defined by the lower limit of the time selected from 0.3 t, 1.0 t, or 1.2 t, and the upper limit of the time selected from 4 t, 3.4 t, 3 t, or 2.7 t. The t (min) is the etching time at which all of the polyimide layer (a) is removed in theory.

$$t(\min) = \frac{\text{Thickness of polyimide layer } (a)(\mu m)}{\text{Etching rate in the direction of thickness of polyimide layer } (a)(\mu m/\min)}$$

Meanwhile, it is preferred that the depth of the flaw which occurs during the production and transport of the polyimide film, or the like, is taken into consideration for the desmear treatment condition. For obtention of a substrate in which the interface between the conductor layer or the conductor wiring pattern and the polyimide is smooth, it is necessary to etch the polyimide film under conditions that the polyimide film is etched at least to the depth of the flaw.

According to the method of the present invention for producing a multilayer wiring substrate, a conductor layer is formed on all or part of the surface of the polyimide film which was subjected to desmear treatment as described above, and within the via. The method for forming a conductor layer is not specifically limited, and any method such as dry plating, wet plating, and application or printing of metal ink may be used. Examples of the dry plating include vacuum deposition, sputtering, ion plating, and electron beam. Examples of the wet plating include electroless plating, and electrolytic plating. Examples thereof also include a method wherein a conductor layer is formed by applying or printing an ink containing metal nanoparticles, and then subjecting the ink to heat treatment or light irradiation.

In the method of the present invention for producing a multilayer wiring substrate, a conductor layer may be preferably formed by metallizing all or part of the surface of the polyimide film and the inside of the via by electroless plating. Additionally, electrolytic plating may be further performed after the performance of electroless plating. It is preferred that a conductor layer is formed by a method wherein electroless nickel plating is performed, and then electrolytic copper plating is further performed, for example. The electroless plating may be performed using a conventionally-known method. Examples thereof include the Elfseed Process of JCU Corporation, and the SLP process, Top Piena Process of Okuno Chemical Industries Co., Ltd.

Additionally, when the wiring pattern of the conductor layer is formed, the wiring pattern may be formed using a known method. Typical examples of the method include the subtract process wherein a resist pattern is formed on the electrolytic copper plating layer by a photo process, and the metal, layer in the portion where no resist is present is removed, and then the resist is removed, and the semi-additive process wherein a resist pattern is formed on the electroless nickel plating layer by a photo process, and the wiring is formed by electrolytic copper plating in the portion where no resist is present, and then the resist and the electroless nickel plating layer under the resist is removed. Thus a multilayer wiring substrate may be obtained.

EXAMPLES

The present invention will be described in detail hereinafter with reference to Examples and Comparative Examples. However, the present invention is not limited to the Examples, The measurement methods in the Examples described below are as follows.

<Adhesion Evaluation>

An IC tape having a width of 5 mm as a mask was stuck on the conductor layer (metal layer) of the conductor (metal)-laminated polyimide film, and then the conductor layer was etched with ferric chloride and removed. Subsequently, the IC tape was peeled away, and then samples heated at 150° C. for 1 hour, for 24 hours, and for 168 hours, respectively, were prepared.

The 90° peel strengths of the samples were measured in accordance with JIS K 6854-1 using EZ Test (made by Shimadzu Corporation).

Among the peel strengths in Tables 3 to 6:

"150° C. 1 h" is the 90° peel strength of the sample heated at 150° C. for 1 hour, "150° C. 24 h" is the 90° peel strength of the sample heated at 150° C. for 24 hours, and "150° C. 168 h" is the 90° peel strength of the sample heated at 150° C. for 168 hours.

<Chemical Etching Rate>

The polyimide film was subjected to polyimide etching treatment using Lizatron Desmear Process (JCU Corporation) which was a permanganate-based wet desmear system, and the depth (μm) of the polyimide film etched for 1 minute from the start of etching was measured and the measured value was used as the chemical etching rate (μm/min). The etching treatment was performed under the conditions as shown in Table 1 described below. The adjustment of the concentration of each chemical agent was made by mixing the chemical agent solution (stock solution) purchased from JCU Corporation and pure water. The concentration of manganese derived from permanganate in the etching solution was 2.3 wt %, and the pH was 13.5.

TABLE 1

| Step | Treatment conditions | Chemical agent name | Concentration (mL/L) |
|---|---|---|---|
| Degreasing/Swelling | 50° C. 2 min | DS-110 | 130 |
| | | DS-150B | 65 |
| Etching | 70° C. | DS-250NA | 130 |
| | | DS-150B | 104 |
| Neutralization Reduction | 30° C. 2 min | DS-310 | 65 |
| | | Concentrated sulfuric acid | 13 (g/L) |
| | | DS-320 | 13 |

The abbreviations of the compounds in the Examples described below are as follows,
s-BPDA: 3,3',4,4'-biphenyltetracarboxylic dianhydride
a-BPDA: 2,3,3',4'-biphenyltetracarboxylic dianhydride
PMDA: pyromellitic dianhydride
PPD: p-phenylenediamine
ODA: 4,4'-diaminodiphenyl ether
DMAc: N,N-dimethylacetamide Reference Example 1-1

Equimolar amounts of s-BPDA and PPD were polymerized in DMAc, to provide a polyamic acid solution having a concentration of 18 wt %. Then monostearyl phosphate triethanolamine salt in an amount of 0.1 parts by weight relative to 100 parts by weight of the polyamic acid, and colloidal silica having an average particle size of 0.08 μm were added to the polyamic acid solution, and then 1,2-dimethylimidazole in an amount of 0.05 mole relative to 1 mole of the amic acid unit was added thereto, and the resulting mixture was homogeneously mixed, to provide a polyamic acid solution (B1).

Reference Example 1-2

Equimolar amounts of s-BPDA and ODA were polymerized in DMAc, to provide a polyamic acid solution having a concentration of 18 wt %. Then monostearyl phosphate triethanolamine salt in an amount of 0.1 parts by weight relative to 100 parts by weight of the polyamic acid, and colloidal silica having an average particle size of 0.08 μm were added to the polyamic acid solution, and then 1,2-dimethylimidazole in an amount of 0.05 mole relative to 1 mole of the amic acid unit was added thereto, and the resulting mixture was homogeneously mixed, to provide a polyamic acid solution (B2).

Reference Example 2-1

Equimolar amounts of a-BPDA and ODA were polymerized in DMAc, to provide a polyamic acid solution having a concentration of 5 wt %. Then γ-phenyl aminopropyl trimethoxy silane was added to the polyamic acid solution such that the concentration was 3 wt %, and the resulting mixture was homogeneously mixed, to provide a polyamic acid solution (A1).

Reference Example 2-2

PMDA and s-BPDA, which were used as the tetracarboxylic acid component, and ODA and PPD, which were used as the diamine component, were polymerized in DMAc in a molar ratio of PMDA/s-BPDA/ODA/PPD=65/35/80/20, to provide a polyamic acid solution (A2) having a concentration of 5 wt %.

Reference Example 2-3

Equimolar amounts of PMDA and ODA were polymerized in DMAc, to provide a polyamic acid solution (A3) having a concentration of 5 wt %.

Reference Example 2-4

PMDA and s-BPDA, which were used as the tetracarboxylic acid component, and ODA, which was used as the diamine component, were polymerized in DMAc in a molar ratio of PMDA/s-BPDA/ODA=50/50/100, to provide a polyamic acid solution (A4) having a concentration of 5 wt %.

Reference Example 3-1

The polyamic acid solution (B1) was flow-cast on a stainless substrate, and continuously dried under hot air at 140° C., and then peeled from the substrate, to form a self-supporting film. The polyamic acid solution (A1) was applied to both surfaces of the self-supporting film by means of a die coater such that the thickness of the layer after heating/drying was 0.6 μm, and then the film was gradually heated from 200° C. to 575° C. in a heating oven, thereby removing the solvent therefrom and imidizing the film, to provide a polyimide film F1 having a thickness of 12.5 μm. The chemical etching rate of the polyimide layer obtained from, the polyamic acid solution (A1) in the film was 0.2 μm/min. The etching time t (min) at which all of the polyimide layer obtained from the polyamic acid solution (A1) is removed in theory is 3 (min) if the etching treatment, or desmear treatment is performed by the same process as the evaluation of the chemical etching rate. As for the polyimide film F1, the ratio of the chemical etching rate of the polyimide constituting the polyimide layer (b) to the chemical etching rate of the polyimide constituting the polyimide layer (a) is ½0.

Reference Example 3-2

The polyamic acid solution (B1) was flow-cast on a stainless substrate, and continuously dried under hot air at 140° C., and then peeled from the substrate, to form a self-supporting film. The polyamic acid solution (A2) was applied to both surfaces of the self-supporting film by means of a die coater such that the thickness of the layer after heating/drying was 0.4 μm, and then the film was gradually heated from 200° C. to 575° C. in a heating oven, thereby removing the solvent therefrom and imidizing the film, to provide a polyimide film F2 having a thickness of 12.5 μM. The chemical etching rate of the polyimide layer obtained from the polyamic acid solution (A2) in the film was 0.1 μm/min. The etching time t (min) at which all of the polyimide layer obtained from the polyamic acid solution (A2) is removed in theory is 4 (min) if the etching treatment, or desmear treatment is performed by the same process as the evaluation of the chemical etching rate. As for the polyimide film F2, the ratio of the chemical etching rate of the polyimide constituting the polyimide layer (b) to the chemical etching rate of the polyimide constituting the polyimide layer (a) is ¹⁄10.

Reference Example 3-3

The polyamic acid solution (B1) was flow-cast on a stainless substrate, and continuously dried under hot air at 140° C., and then peeled from the substrate, to form a self-supporting film. The polyamic acid solution (A3) was applied to both surfaces of the self-supporting film by means of a die coater such that the thickness of the layer after heating/drying was 0.6 µm, and then the film was gradually heated from 200° C. to 575° C. in a heating oven, thereby removing the solvent therefrom and imidizing the film, to provide a polyimide film F3 having a thickness of 12.5 µm. The chemical etching rate of the polyimide layer obtained from the polyamic acid solution (A3) in the film was 0.3 µm/min. The etching time t (min) at which all of the polyimide layer obtained from the polyamic acid solution (A3) is removed in theory is 2 (min) if the etching treatment, or desmear treatment is performed by the same process as the evaluation of the chemical etching rate. As for the polyimide film F3, the ratio of the chemical etching rate of the polyimide constituting the polyimide layer (b) to the chemical etching rate of the polyimide constituting the polyimide layer (a) is 1/30.

Reference Example 3-4

The polyamic acid solution (B1) was flow-cast on a stainless substrate, and continuously dried under hot air at 140° C., and then peeled from the substrate, to form a self-supporting film. The polyamic acid solution (A4) was applied to both surfaces of the self-supporting film by means of a die coater such that the thickness of the layer after heating/drying was 0.6 µm, and then the film was gradually heated from 200° C. to 575° C. in a heating oven, thereby removing the solvent therefrom and imidizing the film, to provide a polyimide film F4 having a thickness of 12.5 µm. The chemical etching rate of the polyimide layer obtained from the polyamic acid solution (A4) in the film was 0.1 µm/min. The etching time t (min) at which all of the polyimide layer obtained from the polyamic acid solution (A4) is removed in theory is 6 (min) if the etching treatment, or desmear treatment is performed by the same process as the evaluation of the chemical etching rate. As for the polyimide film F4, the ratio of the chemical etching rate of the polyimide constituting the polyimide layer (b) to the chemical etching rate of the polyimide constituting the polyimide layer (a) is 1/10.

Reference Example 4-1

The polyamic acid solution (B1) obtained in Reference Example 1-1 was flow-cast on a stainless substrate, and continuously dried under hot air at 140° C., and then peeled from the substrate, to form a self-supporting film. The self-supporting film was gradually heated from 200° C. to 575° C. in a heating oven, thereby removing the solvent therefrom and imidizing the film, to provide a polyimide film B1 having a thickness of 12.5 µm. The chemical etching rate of the film (corresponding to the polyimide layer obtained from the polyamic acid solution (B1)) was 0.01 µm/min.

Reference Example 4-2

The polyamic acid solution (B2) obtained in Reference Example 1-2 was flow-cast on a stainless substrate, and continuously dried under hot air at 140° C., and then peeled from the substrate, to form a self-supporting film. The self-supporting film was gradually heated from 200° C. to 575° C. in a heating oven, thereby removing the solvent therefrom and imidizing the film, to provide a polyimide film B2 having a thickness of 12.5 The chemical etching rate of the film was 0.01 µm/min.

Reference Example 4-3

The polyamic acid solution (A2) obtained in Reference Example 2-2 was flow-cast on a stainless substrate, and continuously dried under hot air at 140° C., and then peeled from the substrate, to form a self-supporting film. The self-supporting film was gradually heated from 200° C. to 575° C. in a heating oven, thereby removing the solvent therefrom and imidizing the film, to provide a polyimide film A2 having a thickness of 12.5 µm. The chemical etching rate of the film was 0.1 µm/min.

Examples 1 to 6

The polyimide film F1 obtained in Reference Example 3-1 was subjected to polyimide etching treatment for 1 minute to 10 minutes by the same process as the evaluation of the chemical etching rate (Lizatron Desmear Process (JCU Corporation)). And then, electroless nickel plating was performed using Elfseed Process (JCU Corporation), to form a nickel plating layer having a thickness of 0.13 µm on the etched surface of the polyimide film. And furthermore, annealing treatment at 150° C. for 1 hour and displacement copper plating treatment were performed, and then electrolytic copper plating was performed at a current density of 2 A/dm$^2$ for 22 minutes in a 75 g/L aqueous solution of copper sulfate, to form a copper layer having a thickness of 10 µm on the nickel plating layer, thereby providing a conductor-laminated polyimide film. The plating conditions are shown in Table 2. The etching treatment time and the results of the evaluations are shown in Table 3.

TABLE 2

| Step | Treatment conditions | Chemical agent name | Concentration (mL/L) |
| --- | --- | --- | --- |
| Degreasing | 50° C. 2 min | ES-100 | 40 |
| Modification | 50° C. 20 sec | ES-200 | 80 |
| Catalyzation | 50° C. 2 min | ES-300 | 250 |
| Reduction | 35° C. 2 min | ES-400A | 10 |
|  |  | ES-400B | 14 (g/L) |
| Electroless Ni plating | 35° C. 8 min | ES-500M | 45 |
|  |  | ES-500C | 45 |
|  |  | ES-500B | 30 |
|  |  | ES-500D | 40 |
| Displacement copper plating | 27° C. 1 min | ES-PDC | 10 |
|  |  | Concentrated sulfuric acid | 30 |

The surface of each of the conductor-laminated polyimide films obtained in Examples 1 to 6 where the conductor layer (metal layer) was etched and removed was observed with a metallographic microscope of 500 magnifications, and the observation revealed that the surface was smooth and no flaw was observed. Additionally, the arithmetic surface roughness Ra of each of the films, which was measured with a laser microscope (VK-8510 made by Keyence Corporation), was 50 nm or less (limit of detection).

Example 7

A conductor-laminated polyimide film was obtained in the same way as in Example 1 except that the polyimide film F2 obtained in Reference Example 3-2 was used and the polyimide etching treatment for 5 minutes was performed. The etching treatment time and the results of the evaluations are shown in Table 3.

The surface of the conductor-laminated polyimide film was observed with a metallographic microscope in the same way as in Examples 1 to 6, and the observation revealed that the surface was smooth and no flaw was observed. Additionally, the arithmetic surface roughness Ra was 50 nm or less (limit of detection).

Comparative Example 1

A conductor-laminated polyimide film was obtained in the same way as in Example 1 except that the polyimide etching treatment was not performed. The results of the evaluations are shown in Table 3.

Comparative Example 2

A conductor-laminated polyimide film was obtained in the same way as in Example 7 except that the polyimide etching treatment was not performed. The results of the evaluations are shown in Table 3.

The surface of each of the conductor-laminated polyimide films obtained in Comparative Examples 1 to 2 where the conductor layer (metal layer) was etched and removed was observed with a metallographic microscope of 500 magnifications, and the observation revealed that the surface was smooth. The arithmetic surface roughness Ra of each of the films, which was measured with a laser microscope (VK-8510 made by Keyence Corporation), was 50 nm or less (limit of detection). However, many flaws were observed and the metal residue was observed.

section of the via portion, and the observation revealed that the connection between the conductor layers was good.

Example 9

A substrate for connection evaluation in which a conductor layer (metal layer) was formed on the surface of the polyimide film F1 was obtained in the same way as in Example 8 except that the desmear treatment time was 10 minutes. The SEM observation was carried out on the cross section of the via portion, and the observation revealed that the connection between the conductor layers was good.

Example 10

A substrate for connection evaluation in which a conductor layer (metal layer) was formed on the surface of the polyimide film F1 was obtained in the same way as in Example 8 except that the desmear treatment time was 3 minutes. The SEM observation was carried out on the cross section of the via portion, and the observation revealed that the connection between the conductor layers was good.

Comparative Example 3

A substrate for connection evaluation in which a conductor layer (metal layer) was formed on the surface of the polyimide film F1 was obtained in the same way as in Example 8 except that the desmear treatment was not performed. The SEM observation was carried out on the cross section of the via portion, and the observation revealed that smear remained in the bottom of the via and the connection between the conductor layers was bad.

TABLE 3

| | Film | (a) (μm) | Chemical etching rate (μm/min) Layer (a) | Layer (b) | Etching time (min) | T (min) | Peel strength (N/mm) 150° C. 1 h | 150° C. 24 h | 150° C. 168 h |
|---|---|---|---|---|---|---|---|---|---|
| Example 1 | F1 | 0.6 | 0.2 | 0.01 | 1 | 0.33t | 0.57 | 0.44 | 0.36 |
| Example 2 | F1 | 0.6 | 0.2 | 0.01 | 2 | 0.76t | 0.52 | 0.43 | 0.35 |
| Example 3 | F1 | 0.6 | 0.2 | 0.01 | 3 | 1.0t | 0.52 | 0.43 | 0.36 |
| Example 4 | F1 | 0.6 | 0.2 | 0.01 | 5 | 1.67t | 0.54 | 0.52 | 0.55 |
| Example 5 | F1 | 0.6 | 0.2 | 0.01 | 8 | 2.67t | 0.61 | 0.57 | 0.50 |
| Example 6 | F1 | 0.6 | 0.2 | 0.01 | 10 | 3.33t | 0.47 | 0.47 | 0.49 |
| Example 7 | F2 | 0.4 | 0.1 | 0.01 | 5 | 1.25t | 0.58 | 0.56 | 0.59 |
| Comparative Example 1 | F1 | 0.6 | 0.2 | 0.01 | 0 | — | 0.24 | 0.27 | 0.29 |
| Comparative Example 2 | F2 | 0.4 | 0.1 | 0.01 | 0 | — | 0.35 | 0.28 | 0.08 |

Example 8

The polyimide film F1 and a laminated sheet having a copper wiring formed thereon were bonded via an epoxy bonding sheet. And then, a blind via having a diameter of 50 μm at the surface and a diameter of 29 μm at the bottom was formed from the polyimide film F1 side by UV-YAG laser (output power: 1.0 W, frequency: 40 kHz), to provide a substrate for connection evaluation.

The substrate for connection evaluation was used, and a substrate for connection evaluation in which a conductor layer (metal layer) was formed on the surface of the polyimide film F1 was obtained in the same way as in Example 1 except that the desmear treatment was performed for 5 minutes. The SEM observation was carried out on the cross Examples 11 to 13

A conductor-laminated polyimide film was obtained in the same way as in Example 1 except that the polyimide film F3 obtained in Reference Example 3-3 was used and the polyimide etching treatment for 1 minute to 5 minutes was performed. The etching treatment time and the results of the evaluations are shown in Table 4.

The surface of the conductor-laminated polyimide film was observed with a metallographic microscope in the same way as in Examples 1 to 6, and the observation revealed that the surface was smooth and no flaw was observed. Additionally, the arithmetic surface roughness Ra was 50 nm or less (limit of detection).

Example 14

A conductor-laminated polyimide film was obtained in the same way as in Example 1 except that the polyimide film F4 obtained in Reference Example 3-4 was used and the polyimide etching treatment for 5 minutes was performed. The etching treatment time and the results of the evaluations are shown in Table 4.

The surface of the conductor-laminated polyimide film was observed with a metallographic microscope in the same way as in Examples 1 to 6, and the observation revealed that the surface was smooth and no flaw was observed. Additionally, the arithmetic surface roughness Ra was 50 nm or less (limit of detection).

TABLE 4

|  | Film | Layer (a) (µm) | Chemical etching rate (µm/min) Layer (a) | Layer (b) | Etching time (min) | T (min) | Peel strength (N/mm) 150° C. 1 h | 150° C. 24 h | 150° C. 168 h |
|---|---|---|---|---|---|---|---|---|---|
| Example 11 | F3 | 0.6 | 0.3 | 0.01 | 1 | 0.5t | 0.95 | 1.03 | 0.95 |
| Example 12 | F3 | 0.6 | 0.3 | 0.01 | 3 | 1.5t | 0.82 | 0.80 | 0.80 |
| Example 13 | F3 | 0.6 | 0.3 | 0.01 | 5 | 2.5t | 0.74 | 0.75 | 0.68 |
| Example 14 | F4 | 0.6 | 0.1 | 0.01 | 5 | 0.83t | 0.69 | 0.82 | 0.63 |

Comparative Example 4

A conductor-laminated polyimide film was obtained in the same way as in Comparative Example 1 except that the polyimide film A2 obtained in Reference Example 4-3 was used. The results of the evaluations are shown in Table 5.

Comparative Example 5

A conductor-laminated polyimide film was obtained in the same way as in Example 1 except that the polyimide film A2 obtained in Reference Example 4-3 was used and the polyimide etching treatment for 5 minutes was performed. The results of the evaluations are shown in Table 5.

Comparative Example 6

A conductor-laminated polyimide film was obtained in the same way as in Comparative Example 1 except that the polyimide film B1 obtained in Reference Example 4-1 was used. The electroless nickel plating could not be performed on the film.

Comparative Example 7

A conductor-laminated polyimide film was obtained in the same way as in Example 1 except that the polyimide film B1 obtained in Reference Example 4-1 was used and the polyimide etching treatment for 5 minutes was performed. The results of the evaluations are shown in Table 5.

TABLE 5

|  | Film | Chemical etching rate (µm/min) | Etching time (min) | Peel strength (N/mm) 150° C. 1 h | 150° C. 24 h | 150° C. 168 h |
|---|---|---|---|---|---|---|
| Comparative Example 4 | A2 | 0.1 | 0 | 0.61 | 0.59 | 0.53 |
| Comparative Example 5 | A2 | 0.1 | 5 | 0.44 | 0.38 | 0.15 |
| Comparative Example 6 | B1 | 0.01 | 0 | — | — | — |
| Comparative Example 7 | B1 | 0.01 | 5 | 0.18 | 0.16 | 0.10 |

Examples 15 to 17

A conductor-laminated polyimide film was obtained in the same way as in Example 1 except that the polyimide film F1 obtained in Reference Example 3-1 was used and the polyimide etching treatment for 25 minutes to 45 minutes was performed by a plasma etching apparatus. The polyimide etching treatment by a plasma etching apparatus was performed at the frequency of 13.55 MHz, the pressure of 0.35 Torr, the air feed rate of 60 ml/min, and the output power of 50 W or 100 W. The etching treatment time and the results of the evaluations are shown in Table 6.

The surface of the conductor-laminated polyimide film was observed with a metallographic microscope in the same way as in Examples 1 to 6, and the observation revealed that the surface was smooth and no flaw was observed. Additionally, the arithmetic surface roughness Ra was 50 nm or less (limit of detection).

Reference Example 5

The polyimide film F1 obtained in Reference Example 3-1 was used, and the etching rate of the polyimide by the plasma etching apparatus was determined. The polyimide film was subjected to polyimide etching treatment under the same conditions as in Examples 15 to 17, and the depth (µm)

of the polyimide film etched for 1 minute from the start of etching was measured and the measured value was used as the etching rate (μm/min), as in the case of the chemical etching rate. The etching rate of the polyimide layer obtained from the polyamic acid solution (A1) in the film was 0.014 μm/min at the output power of 50 W and 0.029 μm/min at the output power of 100 W. The etching time t (min) at which all of the polyimide layer obtained from the polyamic acid solution (A1) is removed by the polyimide etching treatment in theory is 42.9 (min) at the output power of 50 W and 20.7 (min) at the output power of 100 W.

The etching rate of the polyimide constituting the polyimide layer (b) was determined in the same way as described above, using the polyimide film B1 obtained in Reference Example 4-1. The etching rate was 0.013 μm/min at the output power of 50 W and 0.027 μm/min at the output power of 100 W.

tetracarboxylic acid component, and p-phenylenediamine, 4,4'-diaminodiphenyl ether, 4,4'-diaminodiphenyl methane, 2,2-bis(4-aminophenyl)propane, 1,3-bis(4-aminophenoxy benzene), 1,4-bis(4-aminophenoxy)benzene, 4,4'-bis(4-aminophenyl)diphenyl ether, 4,4'-bis(4-aminophenyl)diphenyl methane, 4,4'-bis(4-aminophenoxy)diphenyl ether, 4,4'-bis(4-aminophenoxy)diphenyl methane, 2,2-bis[4-(aminophenoxy)phenyl]propane, or a plurality of compounds selected from these compounds as the diamine component, with the proviso that a polyimide obtained using 3,3',4,4'-biphenyltetracarboxylic acid compound in an amount of 90 mol % or more as the tetracarboxylic acid component, and 4,4'-diaminodiphenyl ether and/or p-phenylenediamine in an amount of 90 mol % or more as the diamine component is excluded.

TABLE 6

| | Film | Layer (a) (μm) | Plasma output power (W) | Etching rate* (μm/min) Layer (a) | Etching rate* (μm/min) Layer (b) | Etching time (min) | Etching time T (min) | Peel strength (N/mm) 150° C. 1 h | Peel strength (N/mm) 150° C. 24 h | Peel strength (N/mm) 150° C. 168 h |
|---|---|---|---|---|---|---|---|---|---|---|
| Example 15 | F1 | 0.6 | 100 | 0.029 | 0.027 | 25 | 1.21t | 0.78 | 0.74 | 0.66 |
| Example 16 | F1 | 0.6 | 100 | 0.029 | 0.027 | 45 | 2.17t | 1.07 | 0.97 | 0.84 |
| Example 17 | F1 | 0.6 | 50 | 0.014 | 0.013 | 45 | 1.05t | 0.71 | 0.63 | 0.48 |

*Etching rate by plasma etching apparatus

The invention claimed is:

1. A method for forming a conductor layer, comprising:
providing a polyimide film consisting of a polyimide layer (b) and a polyimide layer (a) formed on one or both surfaces of the polyimide layer (b);
contacting the polyimide layer (a) of the polyimide film with a polyimide etching solution, so that the etching starts from the surface of the polyimide layer (a) to remove at least part of the polyimide layer (a); and then forming a conductor layer on the surface of the etched polyimide film;
wherein the polyimide etching treatment time T (min), which is represented using t (min) defined by the formula as described below, is within the range of 0.2t<T<5t $$t(\min) = \frac{\text{Thickness of polyimide layer }(a)(\mu m)}{\text{Etching rate in the direction of thickness of polyimide layer }(a)(\mu m/\min)}$$

and wherein the polyimide etching solution etches the polyimide layer (a) faster than the polyimide layer (b).

2. The method for forming a conductor layer according to claim 1, wherein
the polyimide layer (b) consists essentially of a polyimide obtained using a 3,3',4,4'-biphenyltetracarboxylic acid compound in an amount of 90 mol % or more as the tetracarboxylic acid component, and 4,4'-diaminodiphenyl ether and/or p-phenylenediamine in an amount of 90 mol % or more as the diamine component, and
the polyimide layer (a) consists essentially of a polyimide obtained using a 3,3',4,4'-biphenyltetracarboxylic acid compound, a 2,3,3',4'-biphenyltetracarboxylic acid compound, a pyromellitic acid compound, or a plurality of compounds selected from these compounds as the 3. The method for forming a conductor layer according to claim 1, wherein the polyimide layer (a) consists of polyimide obtained from a polyimide precursor composition comprising any one or more of an aminosilane compound, an epoxysilane compound, an aluminum compound, or a titanate compound.

4. The method for forming a conductor layer according to claim 1, wherein the thickness of the polyimide layer (b) is 1 μm to 100 μm, and the thickness of the polyimide layer (a) is 0.05 μm to 5 μm.

5. The method for forming a conductor layer according to claim 1, wherein the polyimide film is a polyimide film obtained by
applying a polyimide precursor solution, which is to be formed into the polyimide layer (a), to at least one surface of a self-supporting film obtained from a polyimide precursor solution, which is to be formed into the polyimide layer (b); and then
subjecting the film to heat treatment at a temperature of 350° C. to 600° C.

6. The method for forming a conductor layer according to claim 1, wherein the polyimide etching treatment is wet etching treatment with a polyimide etching solution, or dry etching treatment by plasma treatment.

7. The method for forming a conductor layer according to claim 1, wherein a metal film layer as the conductor layer is formed on the surface of the polyimide film by electroless plating.

8. A method for producing a multilayer wiring substrate, comprising:
providing a polyimide film consisting of a polyimide layer (b) and a polyimide layer (a) formed on one or both surfaces of the polyimide layer (b);
laminating the polyimide film onto a printed wiring board in which a conductor wiring pattern is formed on an insulation substrate, so that the polyimide layer (a) is exposed at a surface of the polyimide film which is not in contact with the printed wiring board;

forming a via to the conductor wiring pattern from the surface of the polyimide film;

performing a desmear treatment by contacting the polyimide layer (a) of the polyimide film with a polyimide etching solution, so that the etching starts from the surface of the polyimide layer (a) to remove at least a part of the polyimide layer (a); and then forming a conductor layer on all or part of the surface of the etched polyimide film and within the via;

wherein the desmear treatment time T (min), which is represented using t (min) defined by the formula as described below, is within the range of 0.2t<T<5t, and is the time at which the desmearing is completed $$t(\text{min}) = \frac{\text{Thickness of polyimide layer }(a)(\mu m)}{\text{Etching rate in the direction of thickness of polyimide layer }(a)(\mu m/\text{min})}$$

and wherein the polyimide etching solution etches the polyimide layer (a) taster than the polyimide layer (b).

9. The method for producing a multilayer wiring substrate according to claim 8, wherein the polyimide layer (b) consists essentially of a polyimide obtained using a 3,3',4,4'-biphenyltetracarboxylic acid compound in an amount of 90 mol % or more as the tetracarboxylic acid component, and 4,4'-diaminodiphenyl ether and/or p-phenylenediamine in an amount of 90 mol % or more as the diamine component, and the polyimide layer (a) consists essentially of a polyimide obtained using a 3,3',4,4'-biphenyltetracarboxylic acid compound, a 2,3,3',4'-biphenyltetracarboxylic acid compound, a pyromellitic acid compound, or a plurality of compounds selected from these compounds as the tetracarboxylic acid component, and p-phenylenediamine, 4,4'-diaminodiphenyl ether, 4,4'-diaminodiphenyl methane, 2,2-bis(4-aminophenyl)propane, 1,3-bis(4-aminophenoxy benzene), 1,4-bis(4-aminophenoxy)benzene, 4,4'-bis(4-aminophenyl)diphenyl ether, 4,4'-bis(4-aminophenyl)diphenyl methane, 4,4'-bis(4-aminophenoxy)diphenyl ether, 4,4'-bis(4-aminophenoxy)diphenyl methane, 2,2-bis[4-(aminophenoxy)phenyl]propane, or a plurality of compounds selected from these compounds as the diamine component, with the proviso that polyimide obtained using 3,3',4,4'-biphenyltetracarboxylic acid compound in an amount of 90 mol % or more as the tetracarboxylic acid component, and 4,4'-diaminodiphenyl ether and/or p-phenylenediamine in an amount of 90 mol % or more as the diamine component is excluded.

10. The method for producing a multilayer wiring substrate according to claim 8, wherein the polyimide layer (a) consists of polyimide obtained from a polyimide precursor composition comprising any one or more of an aminosilane compound, an epoxysilane compound, an aluminum compound, or a titanate compound.

11. The method for producing a multilayer wiring substrate according to claim 8, wherein the thickness of the polyimide layer (b) is 1 μm to 100 μm, and the thickness of the polyimide layer (a) is 0.05 μm to 5 μm.

12. The method for producing a multilayer wiring substrate according to claim 8, wherein the polyimide film is a polyimide film obtained by applying a polyimide precursor solution, which is to be formed into the polyimide layer (a), to at least one surface of a self-supporting film obtained from a polyimide precursor solution, which is to be formed into the polyimide layer (b); and then subjecting the film to heat treatment at a temperature of 350° C. to 600° C.

13. The method for producing a multilayer wiring substrate according to claim 8, wherein the desmear treatment is wet etching treatment with a polyimide etching solution, or dry etching treatment by plasma treatment.

14. The method for producing a multilayer wiring substrate according to claim 8, wherein the conductor layer is formed by metallizing all or part of the surface of the polyimide film and the inside of the via by electroless plating after the desmear treatment is performed.

* * * * *

UNITED STATES PATENT AND TRADEMARK OFFICE
CERTIFICATE OF CORRECTION

PATENT NO. : 10,149,394 B2
APPLICATION NO. : 15/113234
DATED : December 4, 2018
INVENTOR(S) : Toru Miura et al.

Page 1 of 1

It is certified that error appears in the above-identified patent and that said Letters Patent is hereby corrected as shown below:

In the Specification

Column 1, Line 12, "2015," should be --2014,--.

Column 5, Line 62, "and," should be --and--.

Column 9, Line 41, "hexamethylsulforamide;" should be --hexamethylsulfonamide;--.

Column 10, Lines 21-22, "β-(3,4'-epoxycyclohexyl)" should be --β-(3,4-epoxycyclohexyl)--.

Column 12, Line 2, "μM" should be --μm--.

Column 12, Line 16, "solution," should be --solution--.

Column 14, Line 28 (approx.), "Examples," should be --Examples.--.

Column 16, Line 51, "μM." should be --μm.--.

Column 18, Line 2, "12.5" should be --12.5 μm.--.

In the Claims

Column 25, Line 24, (Claim 8), "taster" should be --faster--.

Signed and Sealed this
Twenty-first Day of May, 2019

Andrei Iancu
*Director of the United States Patent and Trademark Office*